United States Patent
Yu et al.

(10) Patent No.: US 10,020,344 B2
(45) Date of Patent: Jul. 10, 2018

(54) CIS CHIPS AND METHODS FOR FORMING THE SAME

(71) Applicant: Taiwan Semiconductor Manufacturing Company, Ltd., Hsin-Chu (TW)

(72) Inventors: Chen-Hua Yu, Hsin-Chu (TW); Wen-Chih Chiou, Zhunan Township (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/137,104

(22) Filed: Apr. 25, 2016

(65) Prior Publication Data
US 2016/0240583 A1 Aug. 18, 2016

Related U.S. Application Data

(62) Division of application No. 13/558,063, filed on Jul. 25, 2012, now Pat. No. 9,324,756.

(51) Int. Cl.
| | | |
|---|---|---|
| H01L 21/00 | (2006.01) |
| H01L 27/146 | (2006.01) |
| H01L 31/02 | (2006.01) |
| H01L 31/0232 | (2014.01) |
| H01L 21/768 | (2006.01) |
| H01L 23/48 | (2006.01) |
| H01L 21/683 | (2006.01) |
| H01L 23/00 | (2006.01) |

(52) U.S. Cl.
CPC .... *H01L 27/14689* (2013.01); *H01L 21/6835* (2013.01); *H01L 21/76834* (2013.01); *H01L 21/76879* (2013.01); *H01L 21/76898* (2013.01); *H01L 23/481* (2013.01); *H01L 27/1462* (2013.01); *H01L 27/14621* (2013.01); *H01L 27/14627* (2013.01); *H01L 27/14636* (2013.01); *H01L 27/14685* (2013.01); *H01L 27/14687* (2013.01); *H01L 31/02002* (2013.01); *H01L 31/02327* (2013.01); *H01L 24/13* (2013.01); *H01L 2221/6834* (2013.01); *H01L 2221/68327* (2013.01); *H01L 2224/023* (2013.01); *H01L 2224/13101* (2013.01)

(58) Field of Classification Search
CPC ......... H01L 27/14689; H01L 27/14685; H01L 27/14687; H01L 31/02002; H01L 27/14627; H01L 27/14621
USPC ............. 257/432; 438/70, 93, 620, 622, 637
See application file for complete search history.

(56) References Cited

U.S. PATENT DOCUMENTS

| | | |
|---|---|---|
| 6,057,038 A | 5/2000 | Terashita et al. |
| 6,774,039 B1 | 8/2004 | Drewery |
| 2007/0228576 A1 | 10/2007 | Trezza |

(Continued)

*Primary Examiner* — Robert Huber
(74) *Attorney, Agent, or Firm* — Slater Matsil, LLP

(57) ABSTRACT

A device includes a semiconductor substrate, an image sensor at a front surface of the semiconductor substrate, and a plurality of dielectric layers over the image sensor. A color filter and a micro lens are disposed over the plurality of dielectric layers and aligned to the image sensor. A through via penetrates through the semiconductor substrate. A Redistribution Line (RDL) is disposed over the plurality of dielectric layers, wherein the RDL is electrically coupled to the through via. A polymer layer covers the RDL.

20 Claims, 18 Drawing Sheets

(56) References Cited

U.S. PATENT DOCUMENTS

| | | |
|---|---|---|
| 2008/0237766 A1 | 10/2008 | Kim |
| 2010/0078778 A1* | 4/2010 | Barth .................... H01L 21/568 257/659 |
| 2010/0102426 A1 | 4/2010 | Park et al. |
| 2011/0129955 A1 | 6/2011 | Gambino et al. |
| 2011/0221018 A1 | 9/2011 | Shi et al. |

* cited by examiner

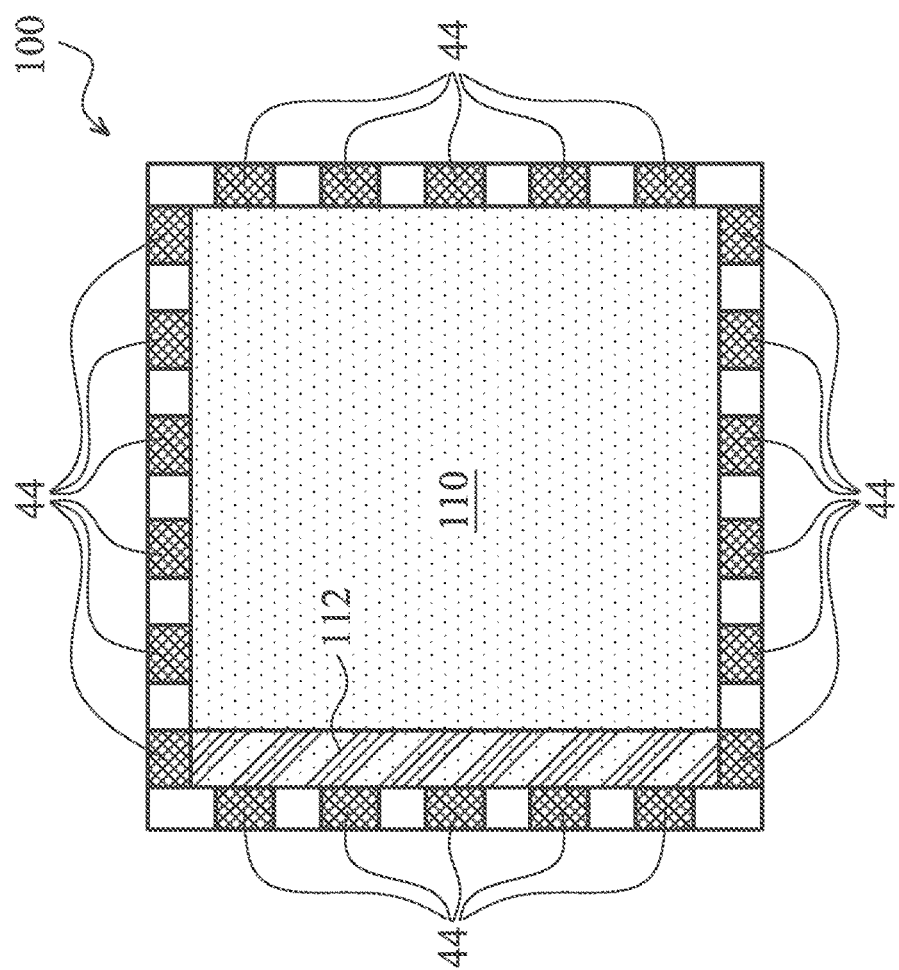

US 10,020,344 B2

CIS CHIPS AND METHODS FOR FORMING THE SAME

PRIORITY CLAIM AND CROSS-REFERENCE

This application is a divisional of U.S. patent application Ser. No. 13/558,063, entitled "CIS Chips and Methods for Forming the Same," filed on Jul. 25, 2012, which application is incorporated herein by reference.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in the minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and length of interconnections between devices as the number of devices increases. When the number and length of interconnections increase, both circuit RC delay and power consumption increase.

Among the efforts for resolving the above-discussed limitations, three-dimensional integrated circuit (3DIC) and stacked dies are commonly used. Through-Silicon vias (TSVs) are often used in 3DICs and stacked dies for connecting dies. In this case, TSVs are used to connect the integrated circuits on a die to the backside of the die. In addition, TSVs may also be used to provide a short grounding path to connect the ground in the integrated circuits to the backside of the die.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 16A are cross-sectional views of intermediate stages in the manufacturing of a Complementary Metal-Oxide-Semiconductor (CMOS) Image Sensor (CIS) chip in accordance with some exemplary embodiments; and FIGS. 16B and 16C are top views of the CIS chip in accordance with exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A process for forming Through-Substrate Vias (TSVs, also referred to as through-silicon vias, through-semiconductor vias, or through vias) in Complementary Metal-Oxide-Semiconductor (CMOS) Image Sensor (CIS) chips is provided. The intermediate stages in the manufacturing the CIS chips are illustrated in accordance with some exemplary embodiments. The variations of the embodiments are discussed. Throughout the various views and illustrative embodiments of the present invention, like reference numbers are used to designate like elements.

Figure 1:
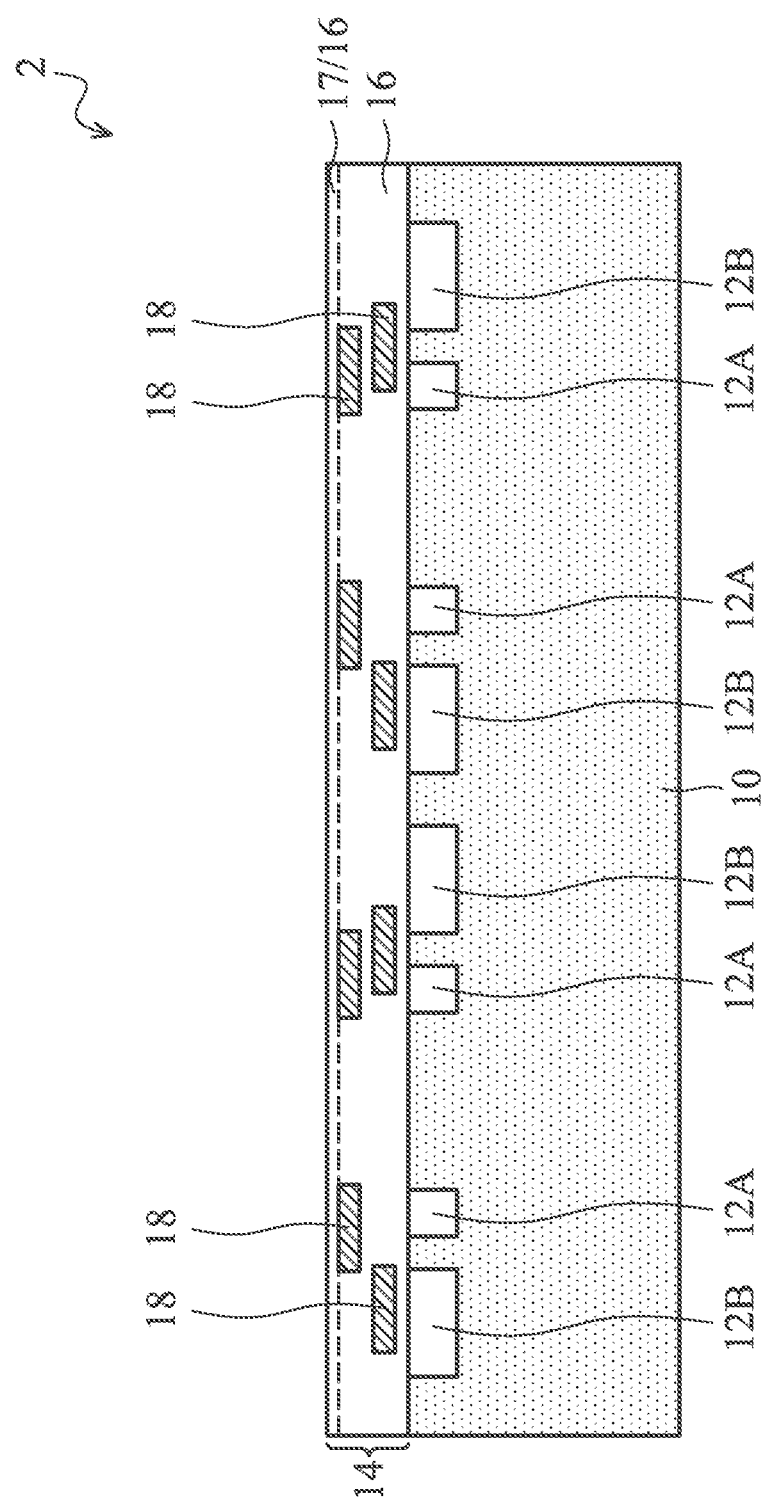

Referring to FIG. 1, wafer 2, which includes substrate 10, is formed. Substrate 10 may be a semiconductor substrate such as a bulk silicon substrate. Alternatively, substrate 10 may include other semiconductor materials such as group III, group IV, and/or group V elements. Integrated circuit devices 12A such as transistors, resistors, capacitors, and the like, may be formed at the top surface (the surface facing up in FIG. 1) of substrate 10. Integrated circuit devices 12A may form the digital controller, digital image processing circuits, and/or the like. In addition, image sensors 12B, which may be photo diodes, are also formed at the top surface of substrate 10. Wafer 2 is thus an image sensor wafer.

Front-side interconnect structure 14 is formed over semiconductor substrate 10, and is used to electrically interconnect devices 12A and image sensors 12B in image sensor wafer 2. Front-side interconnect structure 14 includes dielectric layers 16, and contact plugs, metal lines and vias (schematically illustrated as 18) in dielectric layers 16. Dielectric layers 16 may include an Inter-Layer Dielectric (ILD), Inter-Metal Dielectric (IMD) layers over the ILD, and passivation layer 17 over the IMD layers. For example, the ILD may be formed of Phospho-Silicate Glass (PSG), Boro-Silicate Glass (BSG), Boron-doped Phospho-Silicate Glass (BPSG), Tetra Ethyl Ortho Silicate (TEOS) oxide, or the like. The IMD layers may be formed of low-k dielectric materials, which have k values lower than about 2.5, for example. Passivation layer 17 has a non-low-k value greater than 3.9, and may include an oxide layer and a nitride over the oxide layer, for example. Throughout the description, the metal lines in a same dielectric layer 16 are collectively referred to as being a metal layer. Front-side interconnect structure 14 may include a plurality of metal layers, which may include four or more metal layers.

Figure 2:
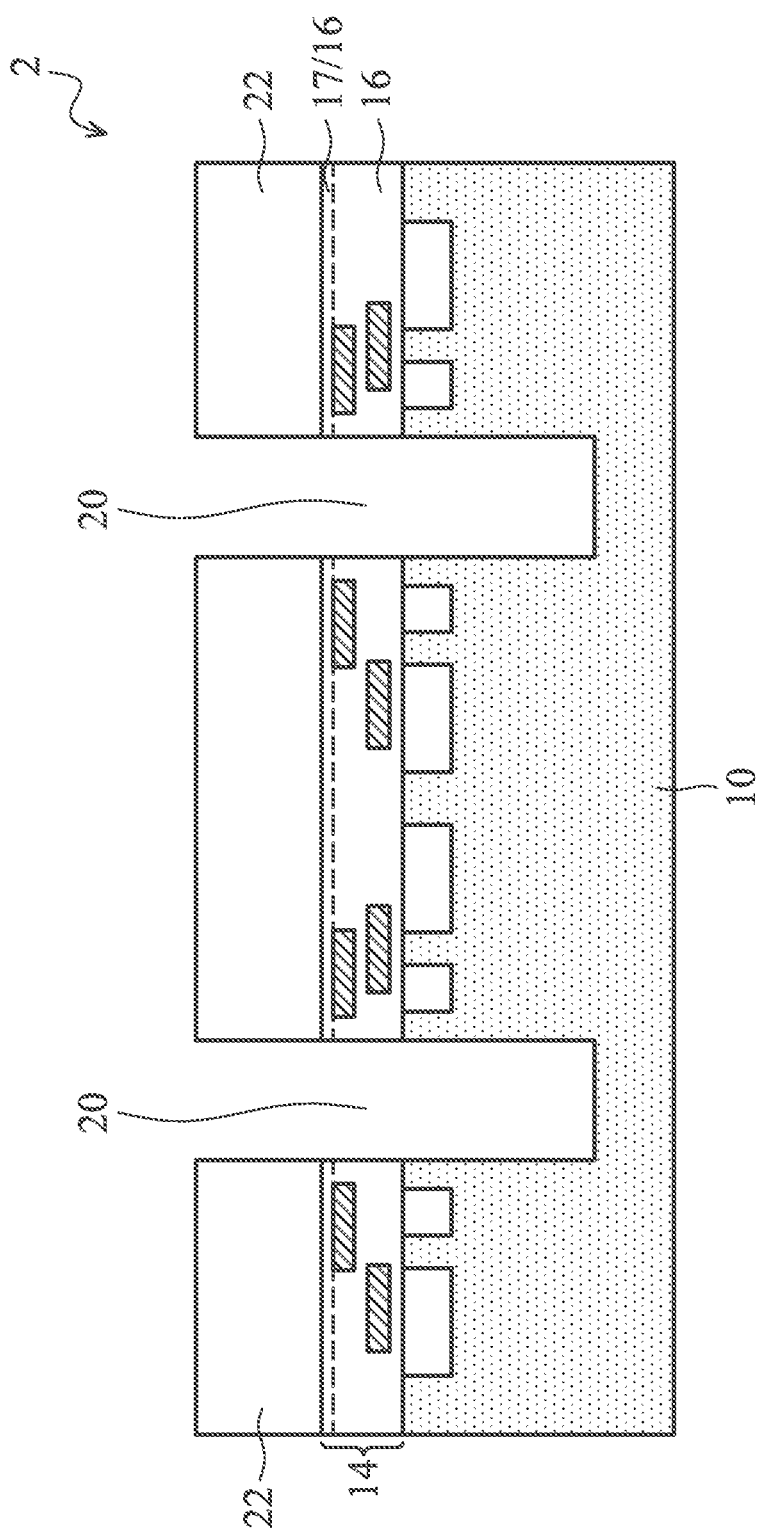

FIG. 2 illustrates the formation and the patterning of photo resist 22, through which the underlying dielectric layers 16 (such as passivation layer 17) is exposed. A first etch is then performed to form TSV openings 20 in dielectric layers 16. Substrate 10 is then etched so that TSV openings 20 further extend into substrate 10, for example, using an anisotropic etch. After the formation of TSV openings 20, photo resist 22 is removed.

Figure 3:
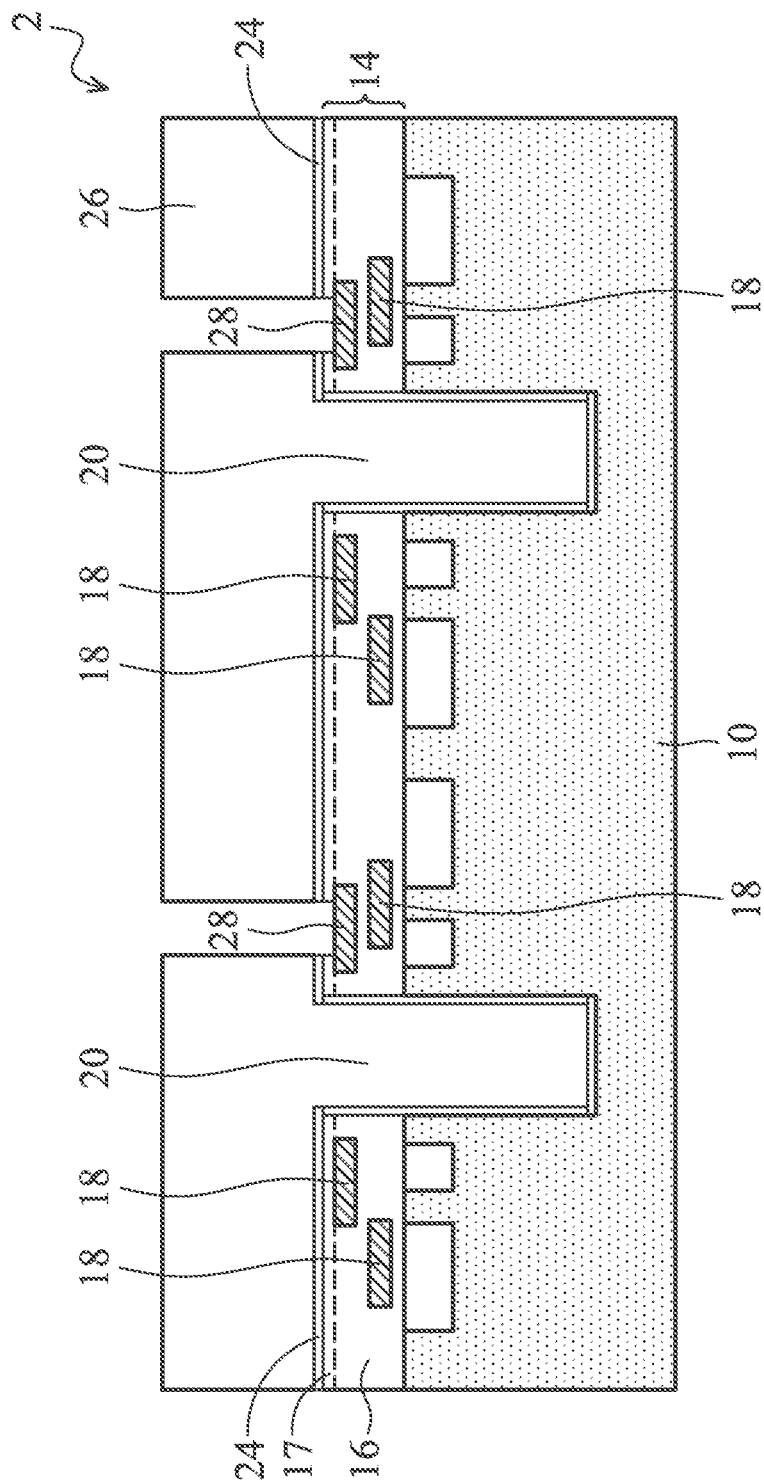

FIG. 3 illustrates the formation of insulating layer 24. Insulating layer 24 may be a blanket layer, and hence includes portions on the sidewalls and the bottoms of TSV openings 20. Insulating layer 24 further includes horizontal portions that are overlying dielectric layers 16. Insulating layer 24 may be formed of dielectric materials such as silicon nitride, silicon carbide, silicon oxynitride, and the like. Next, photo resist 26 is applied and patterned, with the portions photo resist 26 that overlap TSV pads 28 being removed. The portions of insulating layer 24 that are exposed through the patterned photo resist 26 are then etched, exposing the underlying TSV pads 28. Photo resist 26 is then removed. TSV pads 28 may be the metal pads that are formed underlying one of passivation layers (such as passivation layer 17). TSV pads 28 are electrically coupled to devices 12A and/or image sensors 12B in accordance with some embodiments, for example, through metal lines/vias/contact plugs 18. Furthermore, TSV pads 28 may be formed of aluminum copper, although other metallic materials may also be used.

Figure 4:
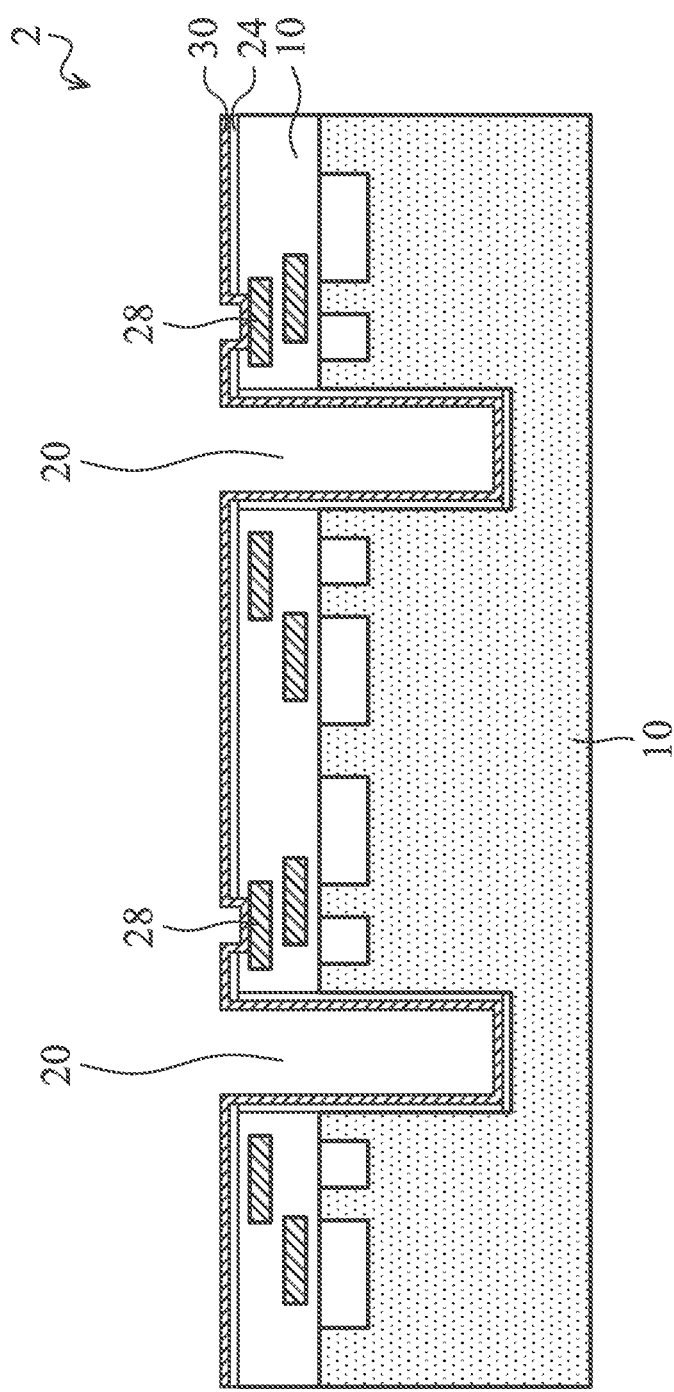

Referring to FIG. 4, diffusion barrier layer 30, also sometimes referred to as a glue layer, is blanket formed to cover the sidewalls and the bottoms of TSV openings 20. Diffusion barrier layer 30 may include a material selected from titanium, titanium nitride, tantalum, tantalum nitride, and combinations thereof, and can be formed using Physical Vapor Deposition (PVD), Plasma Enhanced Chemical Vapor Deposition (PECVD), or the like.

A thin seed layer (also denoted as 30) is then blanket formed on diffusion barrier layer 30. The available materials of seed layer 30 include copper or copper alloys. Furthermore, metals such as silver, gold, aluminum, or combinations thereof may also be used. In some embodiments, seed layer 30 is formed using PVD.

Figure 5:
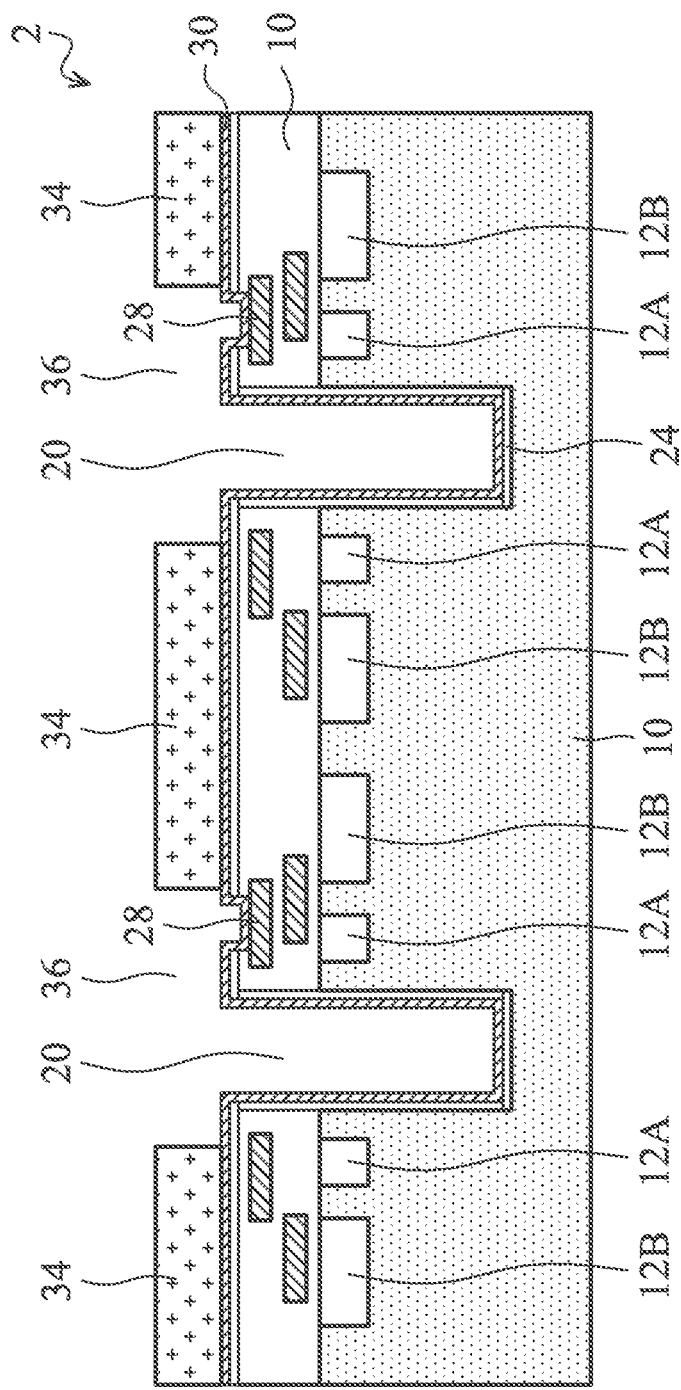

FIG. 5 illustrates the formation of mask 34. In some embodiments, mask 34 is a dry film, and thus is referred to as dry film 34 throughout the description. Dry film 34 may comprise an organic material such as Ajinimoto buildup film (ABF). In the embodiments mask 34 is the dry film, the dry film is laminated on the structure shown in FIG. 4. Heat and pressure are then applied to the laminated dry film to soften it so that a flat top surface is formed. The laminated dry film 34 is then patterned. In alternative embodiments, mask 34 is a photo resist. In some exemplary embodiments, the resulting TSVs 40 (FIG. 6) need to be electrically connected to devices 12A and/or 12B through TSV pads 28. Accordingly, openings 36 are formed in dry film 34, exposing portions of diffusion barrier/seed layer 30, which portions are over TSV pads 28, TSV openings 20, and the region therebetween.

Figure 6:
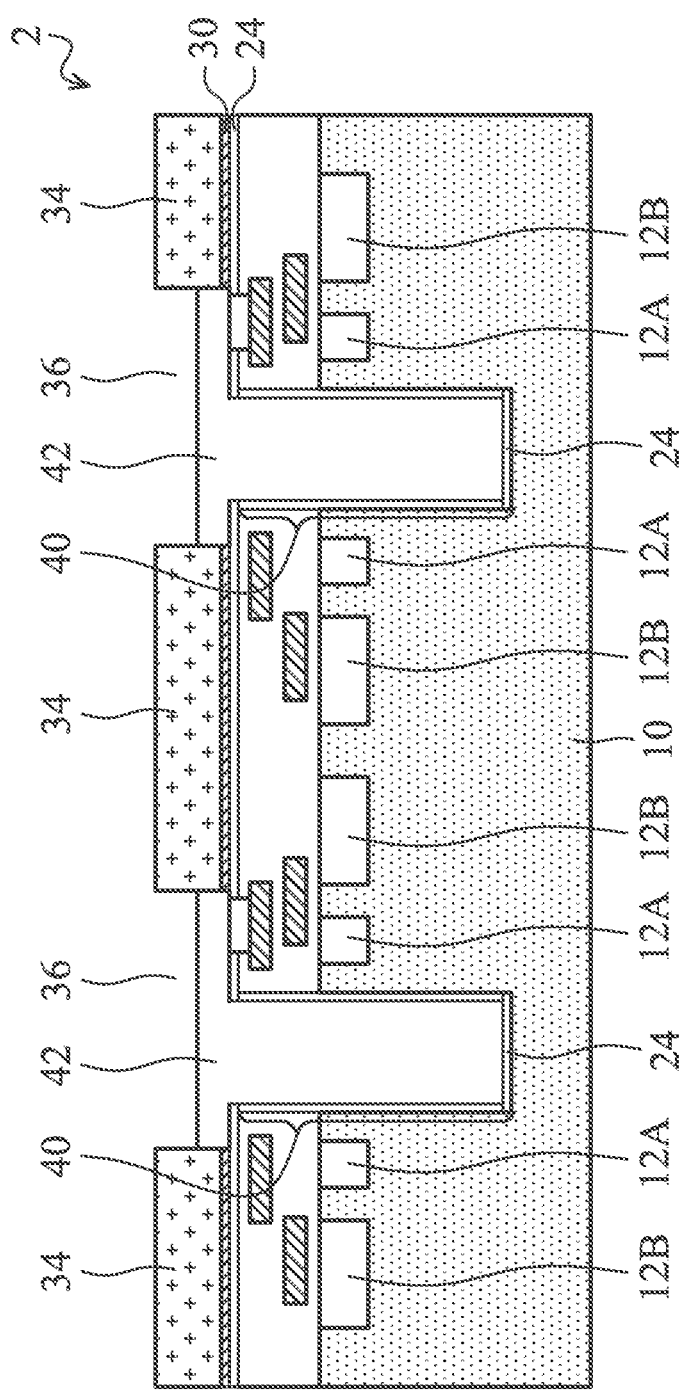

In FIG. 6, TSV openings 20 are filled with a metallic material, forming TSVS 40 in openings 20. In some embodiments, the filling material includes copper or copper alloys. However, other metals, such as aluminum, silver, gold, and combinations thereof, may also be used. The formation method may be electroless plating, for example. After openings 20 are filled, the same metallic material may be continuously filled in openings 36, forming Redistribution lines (RDLs) 42. RDLs 42 are also referred to as Post-Passivation Interconnect (PPI) lines 42, which electrically couple TSV pads 28 to TSVS 40.

Figure 7:
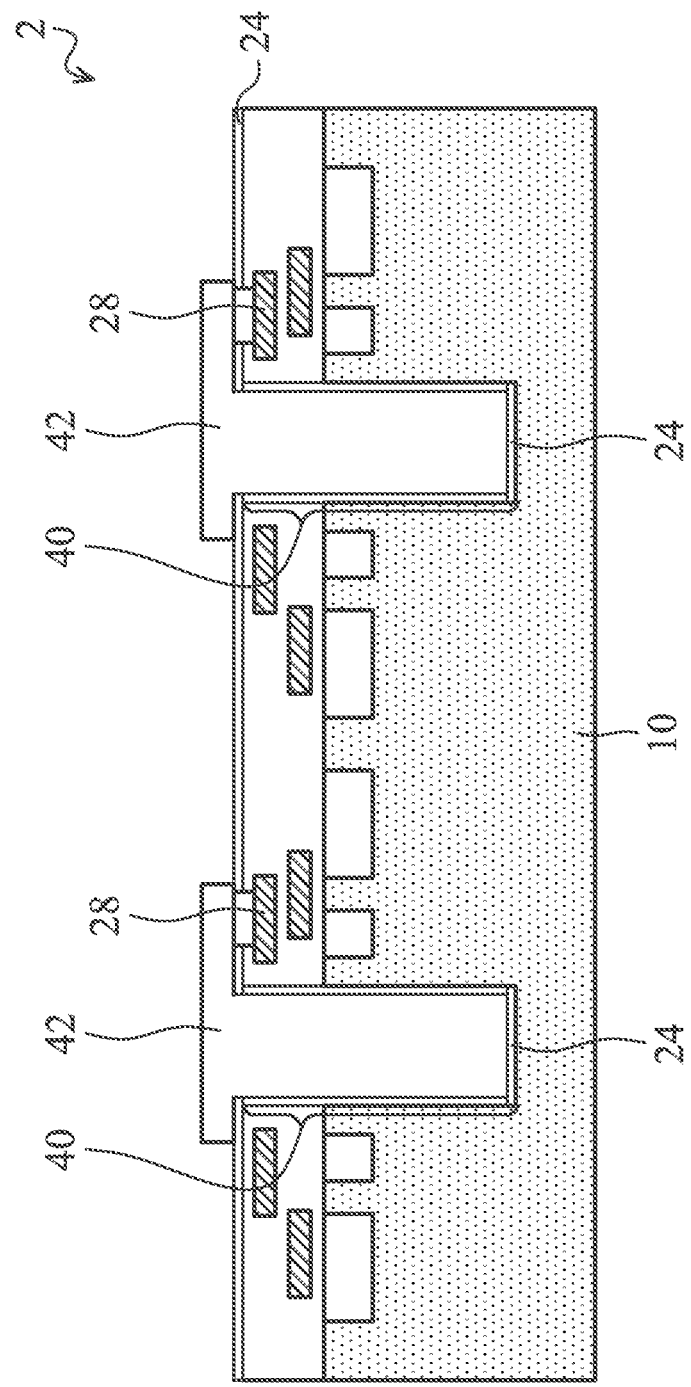

Mask 34 is then removed. As a result, the portions of barrier/seed layer 30, which portions are underlying dry film 34, are exposed. The exposed portions of barrier/seed layer 30 are then removed. The resulting structure is shown in FIG. 7. Barrier/seed layer 30 forms portions of the resulting TSVs 40 and RDLs 42, and hence is not marked in subsequent drawings.

Figure 8:
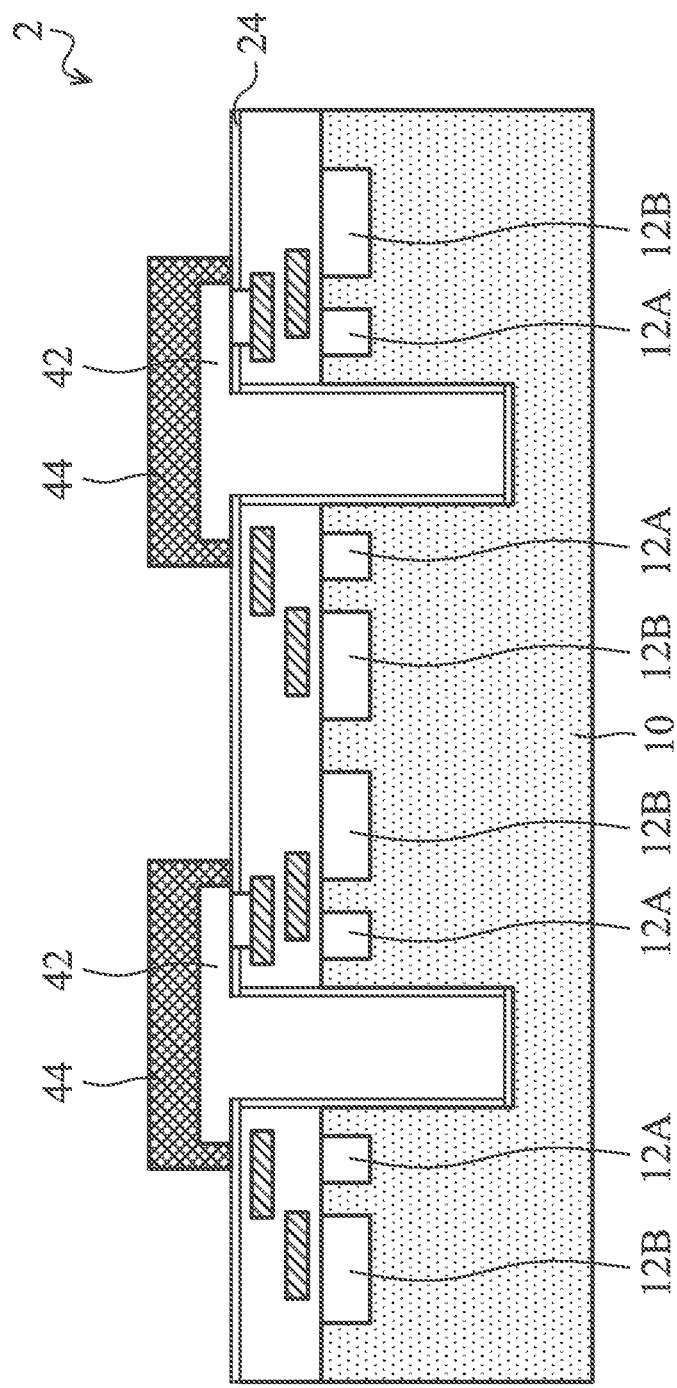

Next, as shown in FIG. 8, polymer layer 44 is dispended and cured. A patterning step is then performed on polymer layer 44 to remove some portions, while leaving some other portions of polymer layer 44 un-removed. Polymer layer 44 may be formed of polyimide, PolyBenzOxazole (PBO), BenzoCycloButene (BCB), or the like, which may be photo-sensitive materials. By using the photo-sensitive material to form polymer 44, the patterning of polymer layer 44 is simplified, and the respective manufacturing cost is reduced. The portions of polymer layer 44 that overlap image sensors 12B are removed. On the other hand, the remaining portions of polymer layer 44 cover the top surfaces and the sidewalls of metal lines 42. Accordingly, metal lines 42 are protected by polymer layer 44, and are isolated from detrimental substances (such as moisture and chemicals) that may damage metal lines 42 and TSVs 40.

Figure 9:
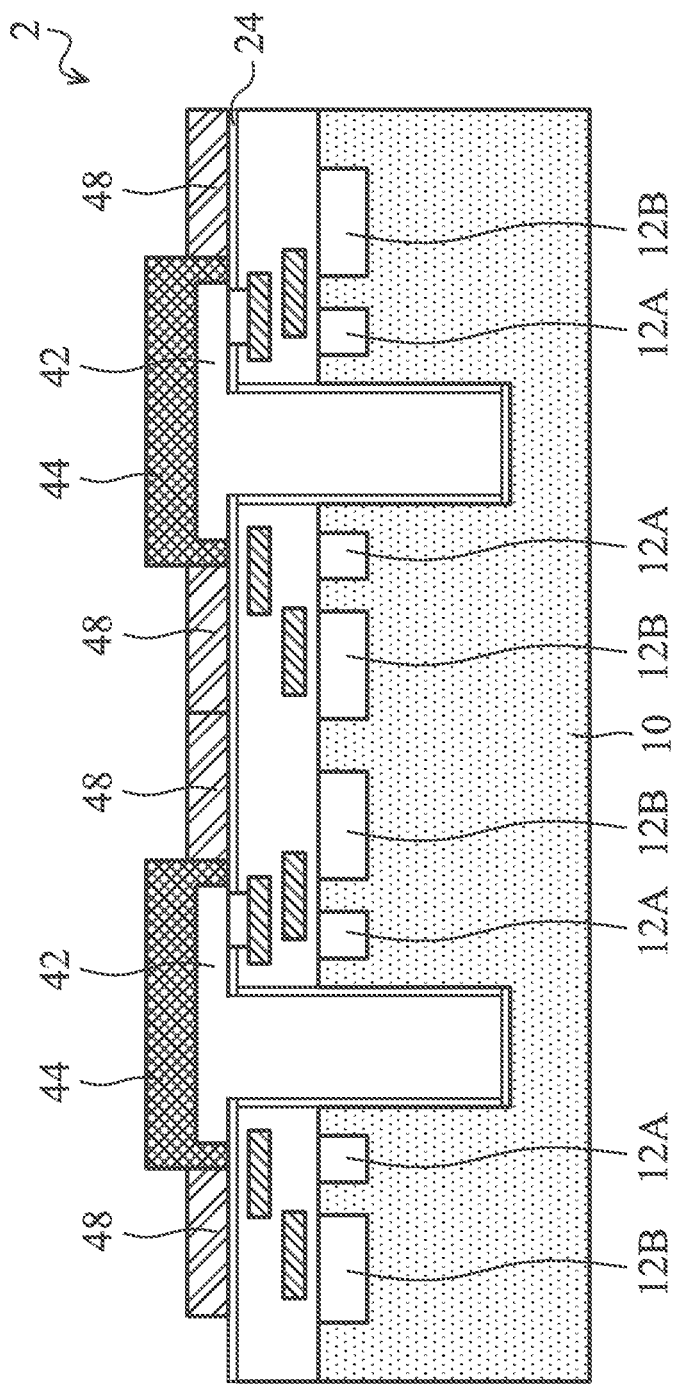
Figure 10:
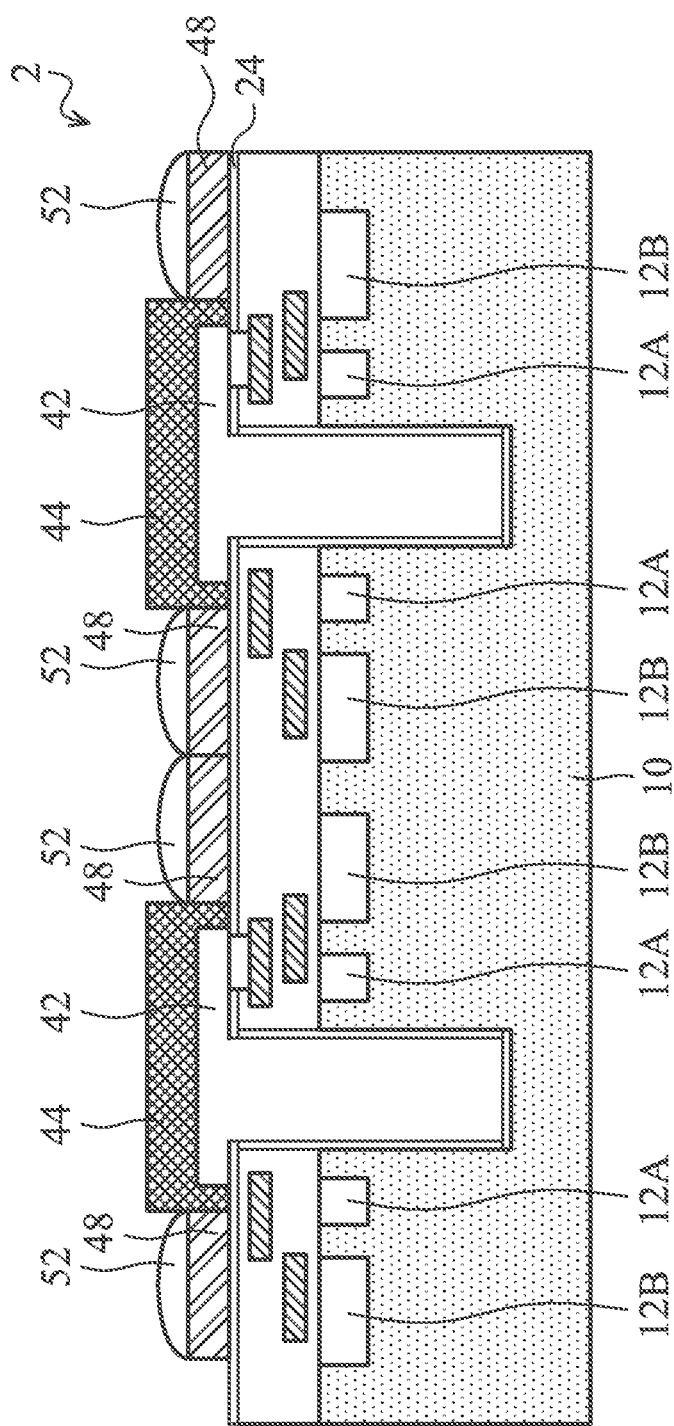

Next, referring to FIG. 9, color filters 48 are formed, which may include red color filters, green color filters, and blue color filters. Color filters 48 may be formed of polymers that are configured to selectively allow the red light, the green light, and the blue light, etc. to pass through. The formation process for each of color filters 48 may include a deposition step and an etching step. In subsequent process steps, as shown in FIG. 10, additional components such as micro lenses 52 are formed, with each of color filters 48 and micro lenses 52 overlapping one of image sensors 12B.

Figure 11:
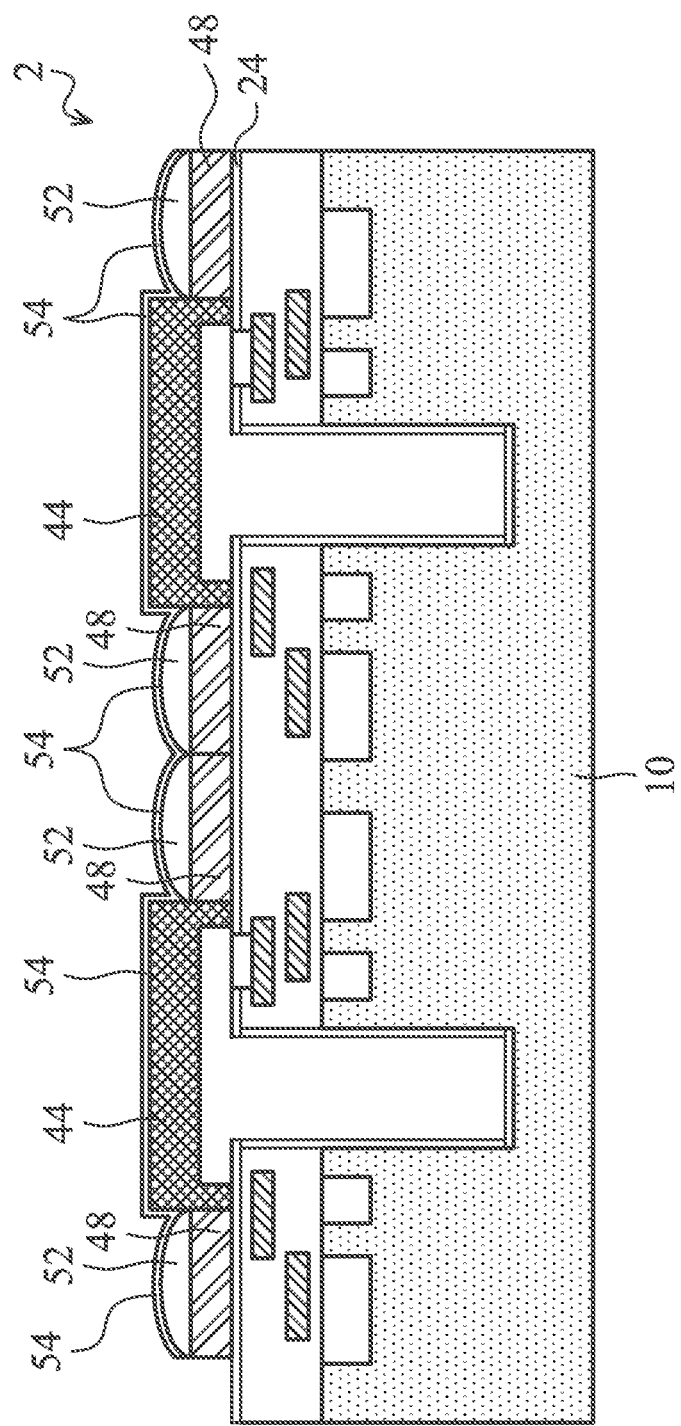
Figure 12:
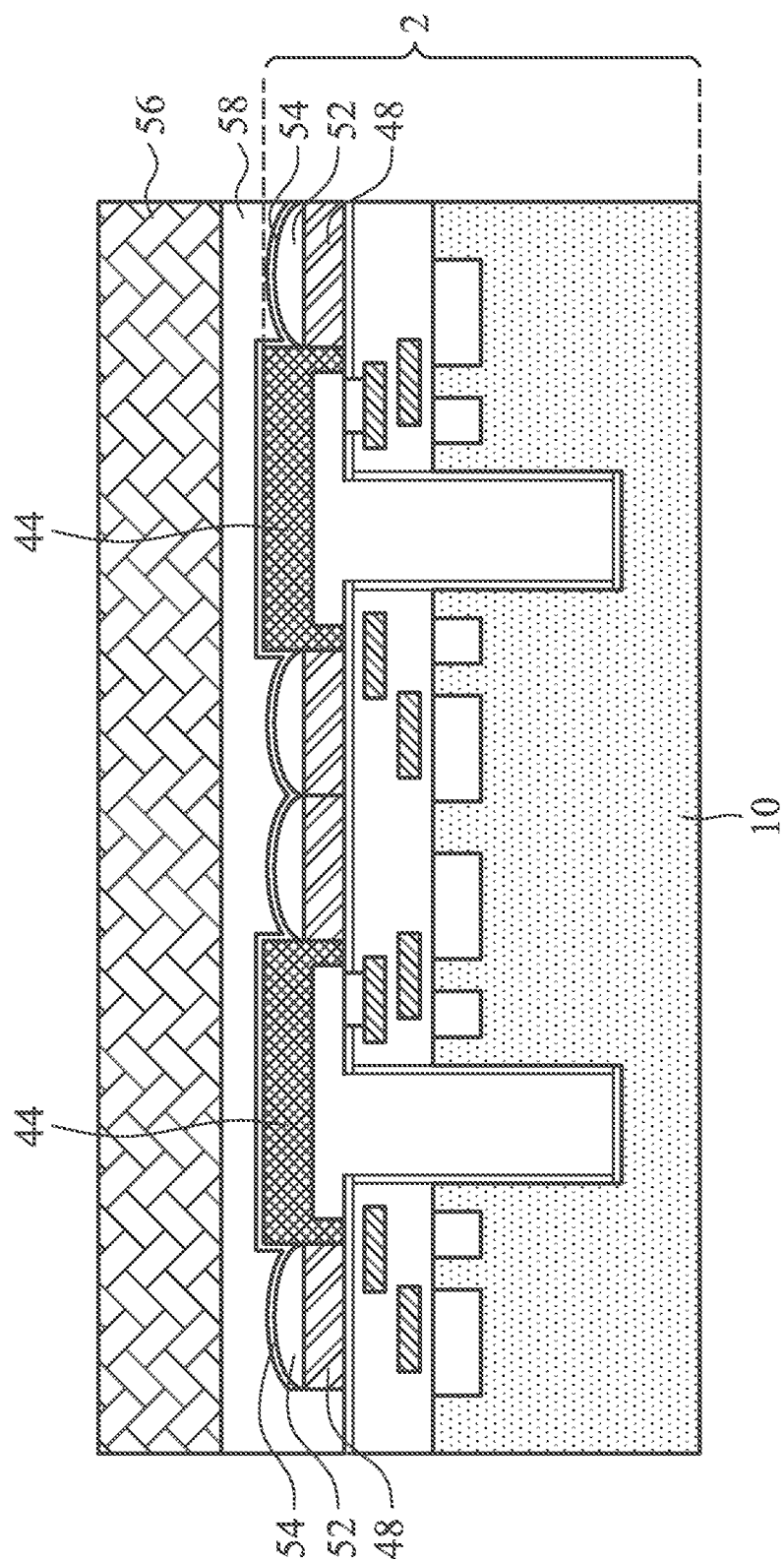
Figure 15:
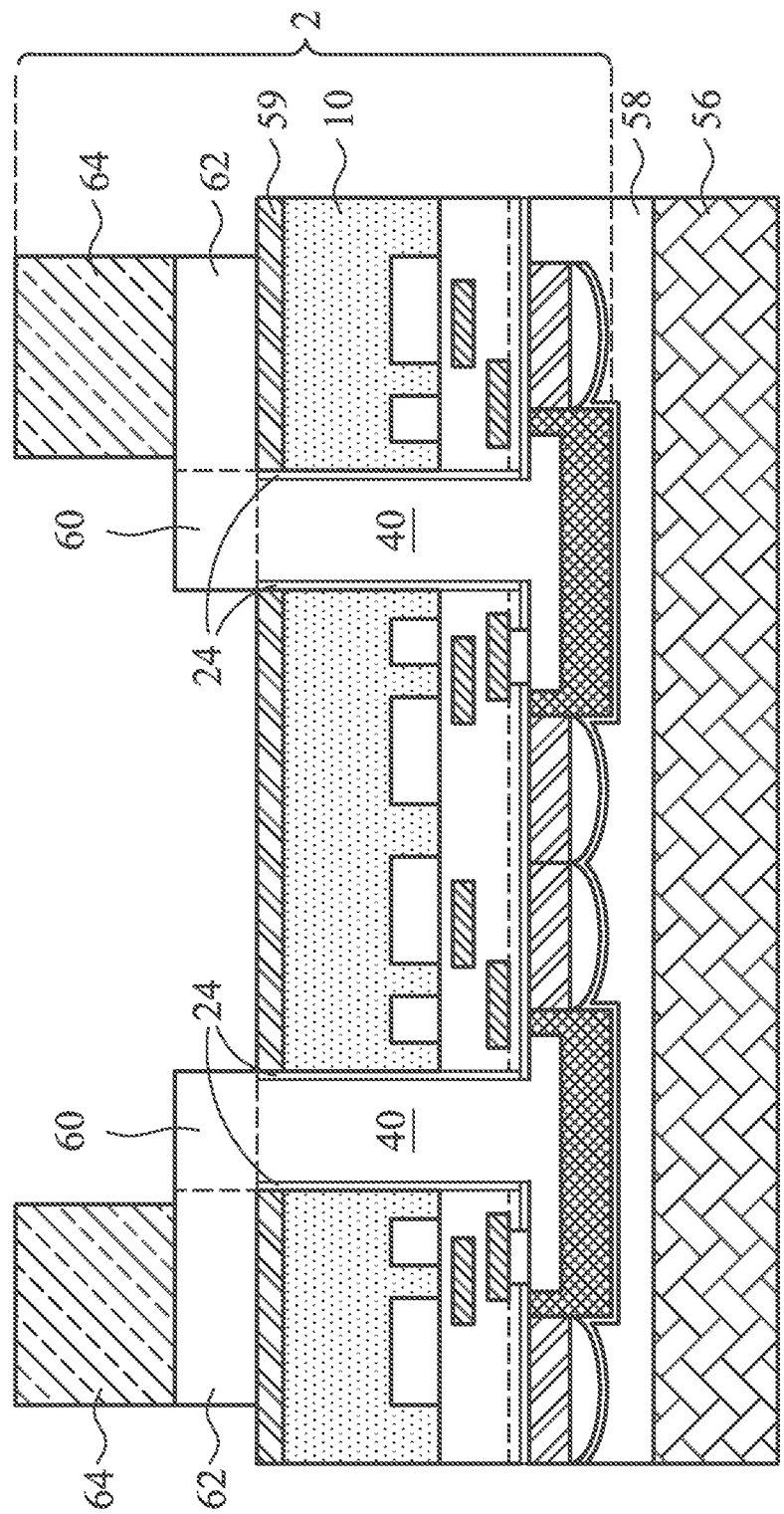

In FIG. 11, protection layer 54 is formed on micro lenses 52, and may be formed on the top surfaces and the sidewalls of polymer layer 44. Protection layer 54 protects micro lenses 52 from being damaged in the subsequent mounting and demounting of carrier 56 (FIGS. 12 and 15). The thickness of protection layer 54 may be smaller so that protection layer 54 is a transparent layer for visible light. In some embodiments, protection layer 54 is an oxide layer (such as a silicon oxide layer), which may be formed using PECVD or the like. Protection layer 54 may also be a TEOS oxide (which is also a silicon oxide), Un-doped Silicate Glass (USG), or the like.

Figure 13:
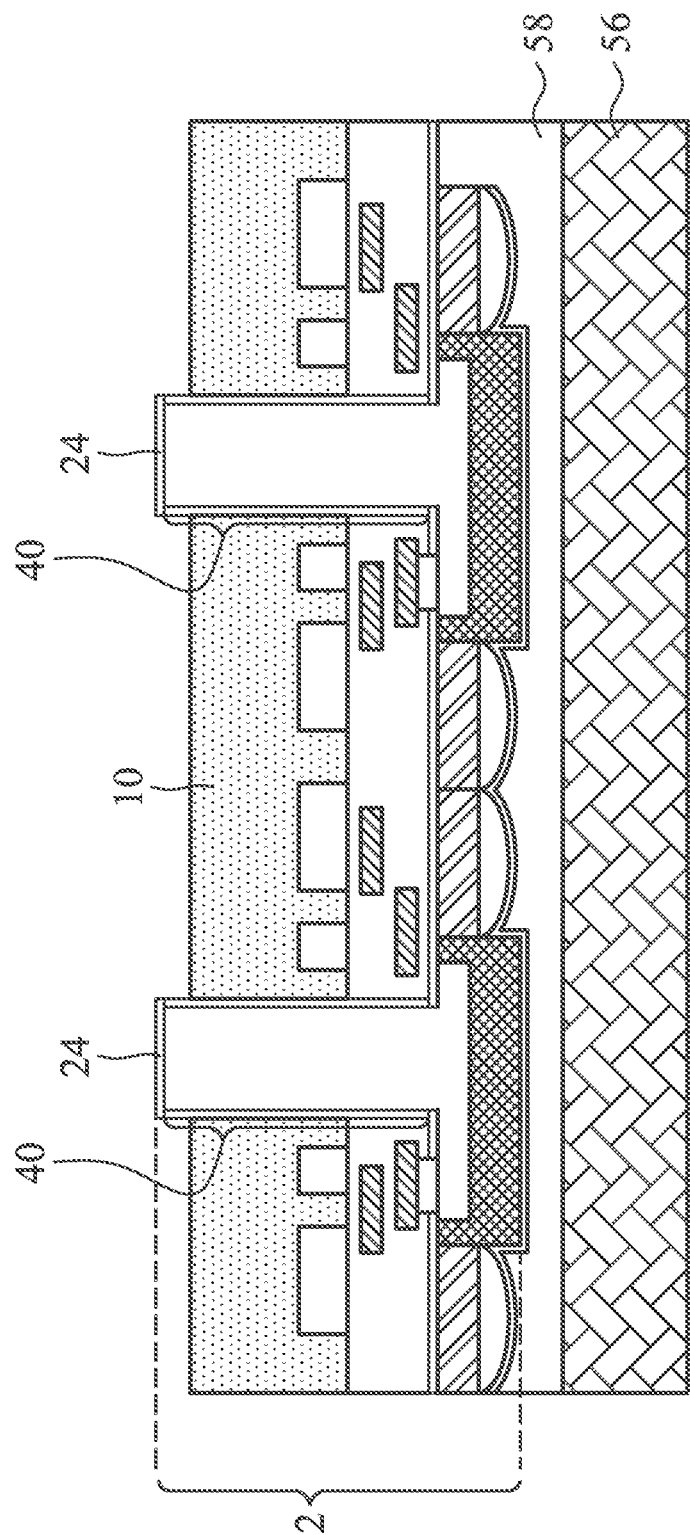
Figure 14:
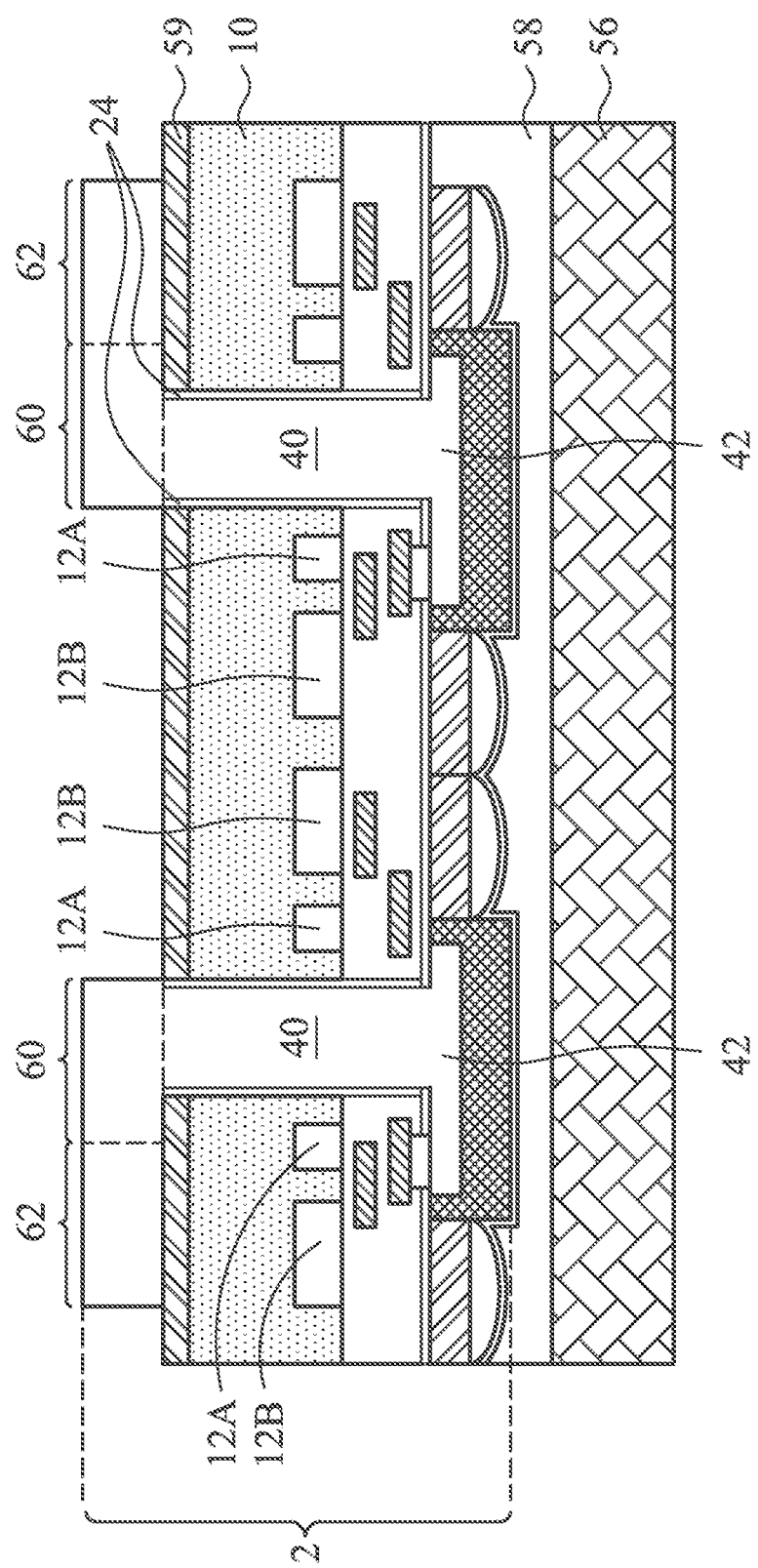

Referring to FIG. 12, wafer 2 is mounted on carrier 56, for example, through adhesive 58, wherein the top surface of wafer 2 faces carrier 56. Carrier 56 may be a glass carrier, for example. Next, as shown in FIG. 13, a thinning step is performed on the back side of substrate 10, until portions of insulating layer 24 are exposed. Dielectric layer 59 is also formed on the backside of substrate 10. Dielectric layer 59 may comprise an oxide, a nitride, or the like. A further grinding may be performed, and portions of dielectric layer 59 and the resulting exposed portions of insulating layer 24 are removed to expose TSVs 40. After the grinding, TSVs 40 protrude out of dielectric layer 59. In subsequent process steps, as shown in FIG. 14, the backside interconnect structures, which may include RDLs 60 and contact pads 62, are formed on the backside of wafer 2, for example, using a method (FIG. 6) similar to the method for forming RDLs 42.

Figure 16A:
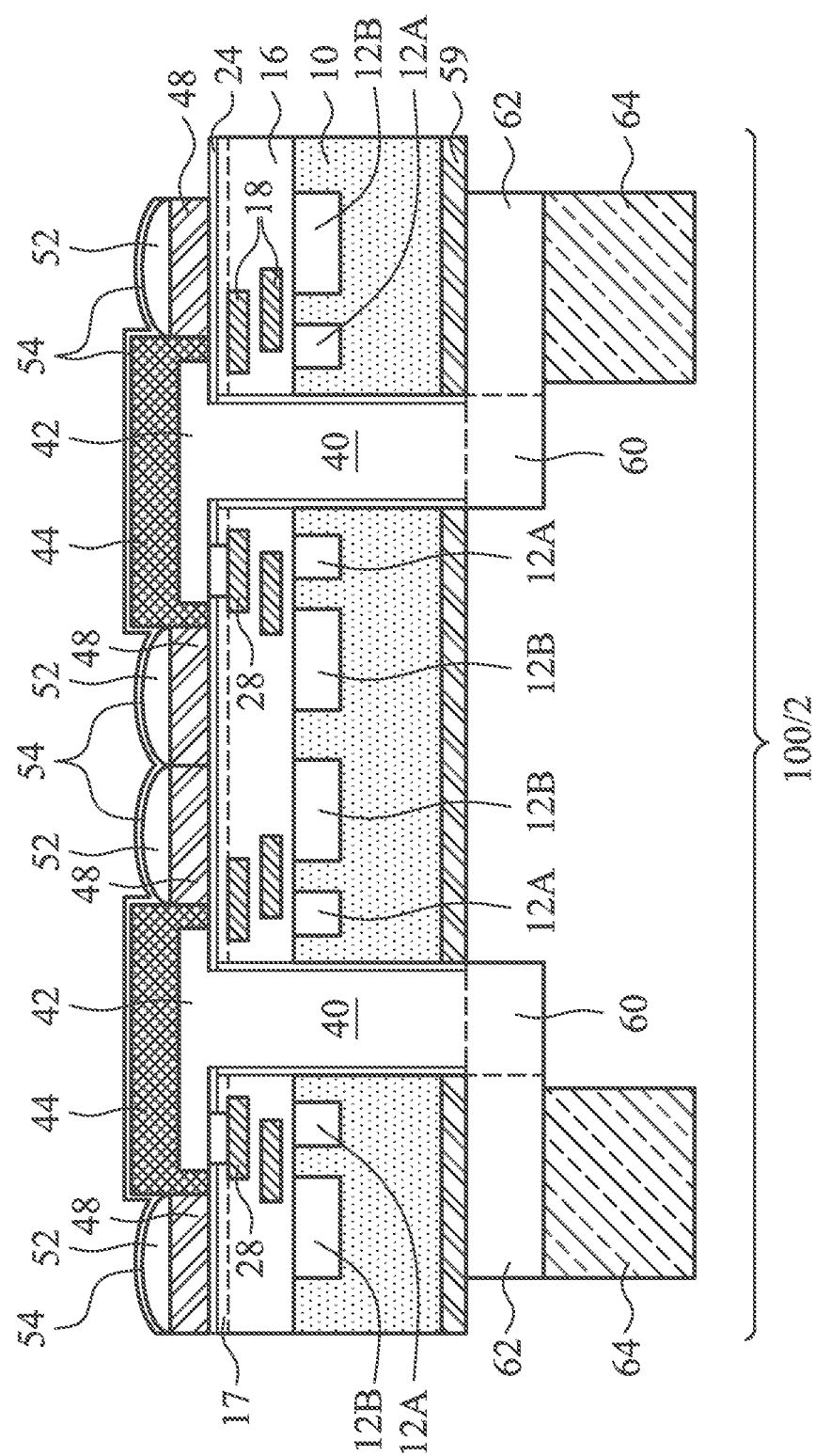

FIG. 15 illustrates the formation of electrical connectors 64. Electrical connectors 64 may be metal pillars, solder balls, composite connectors including metal pillars and overlying pre-solder layers, or the like. In a subsequent step, carrier 56 is demounted from wafer 2. The resulting wafer 2 is shown in FIG. 16A. Wafer 2 may then be diced into dies 100, which have structures identical to each other.

In the structure shown in FIG. 16A, electrical connectors 64 are formed on the backside of chip 100, and are electrically coupled to the integrated circuits (such as 12A and 12B) through metal layers and TSVs 40. On the front side (the illustrated top side) of chip 100, there may not be any electrical connector (such as solder regions) for bonding purposes. Color filters 48 and micro lenses 52 are formed on the front side of chip 100, and hence the resulting chip is a front side illumination CMOS image sensor chip. Polymer layer 44 protects the front-side RDLs 42 from being damaged by the substances in the open air. The backside RDLs 60, on the other hand, may be or may not be protected by polymer layers. When backside RDLs 60 are not protected, in the subsequent bonding process, underfill may be dispensed to protect backside RDLs 60.

Figure 16C:
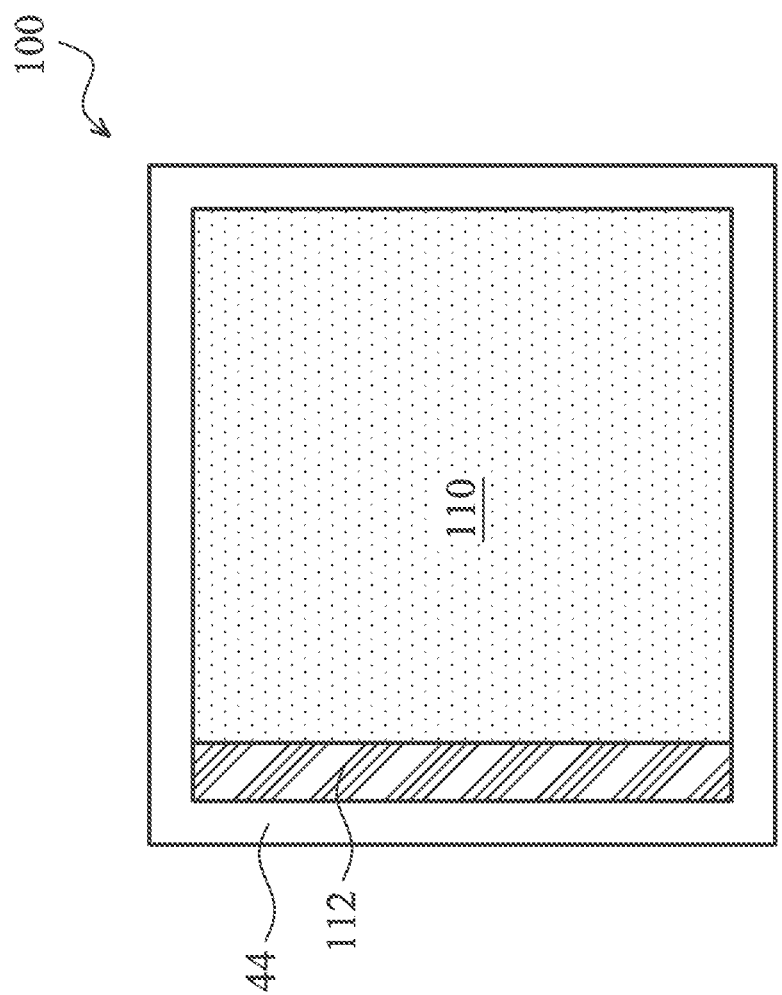

FIG. 16B illustrates a schematic top view of chip 100. As shown in FIG. 16B, chip 100 may include image sensor array 110, which includes image sensors 12B (FIG. 16A) that are laid out as an array. Digital controller 112, which may include Analog-to-Digital Converters (ADCs), Correlated Double Sampling circuits (CDS, also illustrated as 72), row decoders, or other logic circuits, are formed as a part of chip 100. Digital controller 112 may be, or may not be, covered by polymer layer 44. TSVs 40 and RDLs 42 are covered by polymer layer 44, and hence are not shown in FIG. 16B. In some embodiments, as shown in FIG. 16B, polymer layer 44 are patterned into a plurality of discrete portions disconnected from each other, each covering one of TSVs 40 and one of RDLs 42. In alternative embodiments, the illustrated portions of polymer layer 44 may be interconnected as an integrated piece, as shown in FIG. 16C. Again, in these embodiments, polymer layer 44 may or may not include portions aligned to digital controllers 112.

In accordance with embodiments, a device includes a semiconductor substrate, an image sensor at a front surface of the semiconductor substrate, and a plurality of dielectric layers over the image sensor. A color filter and a micro lens are disposed over the plurality of dielectric layers and aligned to the image sensor. A through via penetrates through the semiconductor substrate. A RDL is disposed over the plurality of dielectric layers, wherein the RDL is electrically coupled to the through via. A polymer layer covers the RDL.

In accordance with other embodiments, a device includes a semiconductor substrate, an image sensor array at a front surface of the semiconductor substrate, and an interconnector structure over the image sensor. The interconnector structure includes a plurality of dielectric layers and a passivation layer over the plurality of dielectric layers. A plurality of through vias penetrates through the semiconductor substrate, the plurality of dielectric layers, and the passivation layer. A plurality of RDLs is disposed overlying the passivation layer. A polymer layer is on a top surface and sidewalls of the plurality of RDLs. A plurality of electrical connectors is underlying the semiconductor substrate, wherein the plurality of electrical connectors is electrically coupled to the plurality of RDLs through the plurality of vias.

In accordance with yet other embodiments, a method includes etching a plurality of dielectric layers and a semiconductor substrate underlying the plurality of dielectric layers to form a through via opening. An image sensor is formed at a top surface of the semiconductor substrate, wherein the through via opening extends from the top surface into the semiconductor substrate. The method includes filling the through via opening to form a through via, forming an RDL over and electrically coupled to the through via, forming a color filter and a micro lens over the plurality of dielectric layers and aligned to the image sensor, and forming a polymer layer covering the RDL. The polymer layer is patterned to remove a first portion of the polymer layer that overlaps the micro lens, wherein a second portion of the polymer layer that overlaps the RDL remains after the step of patterning.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    etching a plurality of dielectric layers and a semiconductor substrate underlying the plurality of dielectric layers to form a through-via opening, wherein the through-via opening extends from a top surface of the plurality of dielectric layers into the semiconductor substrate, and an image sensor is located in the semiconductor substrate;
    filling the through-via opening to form a through-via;
    forming a Redistribution Line (RDL) over and electrically coupled to the through-via;
    forming a polymer layer covering the RDL;
    patterning the polymer layer to remove a first portion of the polymer layer that overlaps the image sensor, wherein a second portion of the polymer layer that overlaps the RDL remains after the polymer layer is patterned;
    forming a color filter and a micro lens over the plurality of dielectric layers and aligned to the image sensor;
    forming a protection layer over the color filter and the micro lens;
    attaching the semiconductor substrate and overlying features to a carrier, wherein the protection layer is in contact with an adhesive on the carrier; and
    thinning the semiconductor substrate to expose the through-via.

2. The method of claim 1 further comprising depositing an insulation layer comprising:
    a first portion over the semiconductor substrate, wherein a bottom surface of the RDL contacts a first top surface of the first portion of the insulation layer, and a bottom surface of the color filter contacts a second top surface of the first portion of the insulation layer, and wherein the first top surface and the second top surface of the insulation layer are coplanar with each other; and
    a second portion extending into the semiconductor substrate, with the through-via filling a space of the through-via opening left by the second portion of the insulation layer.

3. The method of claim 2 further comprising, when the RDL is formed, simultaneously forming an additional RDL, with a space left between the RDL and the additional RDL, and the second top surface of the first portion of the insulation layer is exposed to the space, and wherein the color filter and a micro lens are formed in the space.

4. The method of claim 1 further comprising:
    with the protection layer being attached to the adhesive, forming an electrical connector electrically coupled to the through-via, wherein the electrical connector and the polymer layer are on opposite sides of the semiconductor substrate.

5. The method of claim 4 further comprising:
    after the micro lens is formed, forming an oxide layer over the micro lens and remaining portions of the polymer layer.

6. The method of claim 5 further comprising dicing a wafer that comprises the semiconductor substrate, wherein after the wafer is diced, the oxide layer remains on the micro lens.

7. The method of claim 1 further comprising forming a plurality of through-vias in the plurality of dielectric layers and the semiconductor substrate, wherein after the step of patterning the polymer layer, remaining portions of the polymer layer comprises a plurality of discrete portions disconnected from each other, and wherein each of the discrete portions is overlying one of the plurality of through-vias.

8. A method comprising:
etching a plurality of dielectric layers and a semiconductor substrate underlying the plurality of dielectric layers to form a through-via opening, wherein an image sensor is formed in the semiconductor substrate, and wherein the through-via opening extends from a top surface of the semiconductor substrate into the semiconductor substrate;
depositing a dielectric layer, with a first portion of the dielectric layer in the through-via opening, and a second portion of the dielectric layer over the plurality of dielectric layers;
etching the dielectric layer and a portion of the plurality of dielectric layers to expose a metal pad in the plurality of dielectric layers;
forming a through-via in the through-via opening;
forming a first Redistribution Line (RDL) comprising a portion over and connected to the through-via, wherein the RDL further extends into a top layer of the plurality of dielectric layers to contact the metal pad;
covering the first RDL with a dielectric material, wherein the dielectric material comprises a first sidewall portion and a second sidewall portion contacting sidewalls of the RDL, and wherein the RDL is between the first sidewall portion and the second sidewall portion;
forming a color filter and a micro lens overlapping the image sensor;
forming a protection layer covering the micro lens;
attaching the semiconductor substrate and overlying features to a carrier, wherein the protection layer is in contact with an adhesive on the carrier; and
thinning the semiconductor substrate to expose the through-via.

9. The method of claim 8, wherein both the first RDL and the color filter are over and physically contacting the second portion of the dielectric layer.

10. The method of claim 8, wherein the covering the first RDL with the dielectric material comprises:
forming a polymer layer covering the first RDL; and
patterning the polymer layer to remove a first portion of the polymer layer that overlaps the image sensor, wherein a second portion of the polymer layer that overlaps the first RDL remains after the patterning.

11. The method of claim 10, wherein the first sidewall portion of the dielectric material comprises a first sidewall surface physically contacting the RDL, and a second sidewall surface physically contacting the color filter, and the first sidewall surface and the second sidewall surface are opposite to each other.

12. The method of claim 8, wherein the through-via and the first RDL are formed through a same plating process, and the through-via opening is filled entirely by the same plating process.

13. The method of claim 8 further comprising forming a second RDL, with the first RDL and the second RDL formed simultaneously, and the color filter is formed in a space between the first RDL and the second RDL.

14. The method of claim 8, wherein the protection layer further extends on a top surface and a sidewall of the dielectric material.

15. A method comprising:
etching a plurality of dielectric layers and a semiconductor substrate underlying the plurality of dielectric layers to form a through-via opening;
depositing a first dielectric layer, with a first portion of the first dielectric layer in the through-via opening, and a second portion of the first dielectric layer over the plurality of dielectric layers;
performing a plating process to form:
a through-via in the through-via opening, wherein the through-via opening is filled in entirety by the plating process; and
a first Redistribution Line (RDL) physically joined to the through-via, wherein the first RDL comprises a bottom surface contacting the first dielectric layer;
covering the first RDL with a second dielectric layer;
forming a color filter and a micro lens over the color filter, wherein the color filter comprises an additional bottom surface contacting the first dielectric layer;
forming a protection layer covering the micro lens;
attaching the semiconductor substrate and overlying features to a carrier, wherein the protection layer is in contact with an adhesive on the carrier; and
thinning the semiconductor substrate to expose the through-via.

16. The method of claim 15, wherein the covering the first RDL with the second dielectric layer comprises forming a polymer layer.

17. The method of claim 16, wherein the forming the polymer layer comprises:
disposing the polymer layer contacting the first RDL and the first dielectric layer; and
removing portions of the polymer layer to expose the first dielectric layer.

18. The method of claim 15 further comprising forming a second RDL, with the first RDL and the second RDL formed simultaneously, and the color filter is formed in a space between the first RDL and the second RDL.

19. The method of claim 15, wherein the protection layer further extends on a top surface and a sidewall of the second dielectric layer.

20. The method of claim 15, wherein the second dielectric layer is photo sensitive.

* * * * *